United States Patent [19]

Truax et al.

[11] Patent Number: 5,175,774
[45] Date of Patent: Dec. 29, 1992

[54] SEMICONDUCTOR WAFER MARKING FOR IDENTIFICATION DURING PROCESSING

[75] Inventors: Rodney D. Truax; Leo B. Jurica, both of Boise, Id.

[73] Assignee: Micron Technology, Inc., Boise, Id.

[21] Appl. No.: 598,110

[22] Filed: Oct. 16, 1990

[51] Int. Cl.⁵ .............................................. G06K 9/00
[52] U.S. Cl. ........................................ 382/8; 382/11; 382/61; 235/456
[58] Field of Search ................. 382/1, 8, 11, 10, 48, 382/61; 358/101, 106; 235/435, 456, 494; 356/71; 364/488, 489, 490, 491

[56] References Cited

U.S. PATENT DOCUMENTS

| | | | |
|---|---|---|---|
| 3,470,357 | 9/1969 | Ritzerfeld | 382/61 |
| 3,544,771 | 12/1970 | O'Meara | 382/11 |
| 3,776,454 | 12/1973 | Jones | 382/11 |
| 4,162,035 | 7/1979 | Calzetta | 235/456 |
| 4,275,380 | 6/1981 | Gardner et al. | 235/456 |
| 4,409,686 | 10/1983 | Ports et al. | 364/491 |

Primary Examiner—Jose Couso
Attorney, Agent, or Firm—Marger, Johnson, McCollom & Stolowitz

[57] ABSTRACT

A semiconductor wafer (50) is inscribed by a laser scribe system with a numeric wafer identifying number in binary dot-array encoded form to facilitate machine readability. A matrix (20) of predetermined dot locations on the wafer defines a series of parallel columns (e.g. 28) of dot locations, each column corresponding to a respective digit of the ID number. In each column, a number of dots equal to the numeric value of the corresponding digit plus one (N+1) is marked in a contiguous series starting from a baseline row (27,39) of the matrix. A pair of dot arrays (20,30) thus formed are aligned for convenient validity checking. The wafer area required for a dot-array encoded ID number is less than the area required to write a single digit of the ID number in alphanumeric form (14).

2 Claims, 2 Drawing Sheets

SEMICONDUCTOR WAFER MARKING FOR IDENTIFICATION DURING PROCESSING

BACKGROUND OF THE INVENTION

The present invention relates to marking semiconductor wafers such as silicon wafers for subsequently identifying the wafers during integrated circuit fabrication. In particular, the present invention includes a novel binary dot-array encoding scheme for forming reliable, machine-readable identifying markings on a wafer.

It is known in the integrated circuit industry to mark a semiconductor wafer, such as a silicon wafer, early in the integrated circuit fabrication process with an identifying number for identifying the wafer during subsequent processing. The identifying number typically consists of an ordered series of digits that indicate, for example, a fab facility number, lot number and wafer number or the like. The wafers typically are tracked on a computer system to control inventory or to select or control one or more processing steps depending upon the identity a particular wafer.

One known method of marking wafers for such purposes is the use of a laser scribe system. Such a system includes a laser source which "writes" on a wafer in a predetermined pattern, for example to form a numeral or series of numerals, as further described below. The laser beam melts and vaporizes the silicon to form a trench or depression in a predetermined location. Alphanumeric characters may be formed in that manner.

Typically, characters written by a laser scribe system measure in a range of from about 16 by 32 mils up to three times that area. It has been found that such characters may be read by the naked eye under very good light conditions. The characters are difficult to read, however, because silicon wafers are very shiny, i.e. reflective, and the characters are the same color as the remainder of the wafer, so contrast is very limited. Larger characters are easier to discern, but the size of the characters must be traded off against sacrificed wafer area, as circuits formed in the same area as the laser markings are likely to be defective for that reason. Smaller, yet reliably readable identifying markings would be desirable.

A vision system can be used in conjunction with a laser scribe system to allow a computer system to read a wafer identifying number. A vision system allows for greater automation of the integrated circuit fabrication process. It generally incorporates an optical input device such as a microscope or camera, coupled to a light receiver such as a CCD array, in turn coupled to a computer for processing the raw data in an effort to recognize an alphanumeric character.

Automated alphanumeric character recognition is very difficult in the context of silicon wafers. As noted, reflected light can obscure the image, and contrast is very low. Additionally, wafer processing steps such as doping, applying films, photoresist, etc. degrade the laser markings by partially filling in the depressions formed by the laser beam. Consequently, the vision system input data is inherently unreliable. Obviously, misread or unreadable wafer identifying numbers leads to added handling, defective parts, or loss of time and/or materials, all of which translate to higher circuit fabrication costs. Use of redundancy of identifying markings, for example voting on three copies of the number, would improve reliability, but at substantial wafer area expense. Check sums can be added, but again at an expense of two additional characters.

Vision systems adequate for character recognition are expensive, presently costing on the order of $30,000 for hardware. Additional expense is incurred for character recognition software. What is needed is to improve the reliability of reading wafer identifying data, at lower cost, and while minimizing sacrificed wafer area.

SUMMARY OF THE INVENTION

Accordingly, it is an object of the invention to improve reliability of machine identification of semiconductor wafers during circuit fabrication.

Another object of the invention is to reduce the wafer area needed to mark identifying information on a wafer.

Yet another object is to provide redundancy in identifying information marked on wafers to improve reliability and reduce the number of unreadable wafers.

A further object is to reduce the cost of vision systems adequate for automated wafer identification by reducing the required selectivity.

The present invention includes improved methods of marking and reading identifying information, such as lot and wafer numbers, on semiconductor wafers for tracking such wafers through the integrated circuit manufacturing process. According to one aspect of the invention, a numeric string representing a lot and wafer number is encoded in the form of an array of dots inscribed on the wafer surface. The dots are positioned on a matrix of predetermined dot locations. The matrix includes a series of parallel columns, each column corresponding to one digit of the wafer identifying number.

The dot array encoding includes defining a respective number of dots corresponding to each of the numerals 0-10, according to the formula $n = N + 1$, where n is the number of dots and N is the numerical value of the corresponding digit of the identifying number. Each digit in the identifying number is thus encoded to define a corresponding number of dots. In each column of dot locations, the number of dots corresponding to the corresponding digit are marked, extending in a contiguous series above a predetermined baseline. The columns of dots are sequentially arranged in successive columns, side-by-side, to form a two-dimensional dot array. The resulting array is written on the subject wafer, for example by laser inscription.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
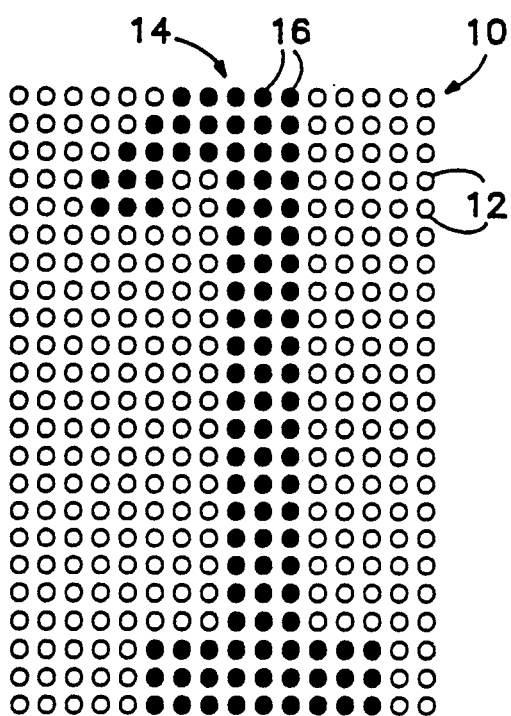
FIG. 1 illustrates a matrix of dot locations in which a predetermined subset of the dot locations have been marked so that the marked dots together form the alphanumeric character "1".

FIG. 1 shows an alphanumeric character ("1") represented in a matrix 10 of dot locations as is known in the prior art. The matrix 10 consists of 16 columns by 23 rows of dot locations, each location being indicated by a small circle, for example dot locations 12. A predetermined alphanumeric character 14, here the number one, is formed in the matrix 10 by writing on (or filling in) a predetermined subset of the dot locations, for example, by use of a laser scribe, to form dots, e.g., dots 16, which together form the character. By marking or alternatively, leaving unmarked, a predetermined subset of the dot locations, virtually any predetermined alphanumeric character can be formed. A series of alphanumeric characters can be marked onto a wafer in this fashion, as further discussed below with regard to FIG. 4, to form a complete wafer identifying number.

Figure 2:
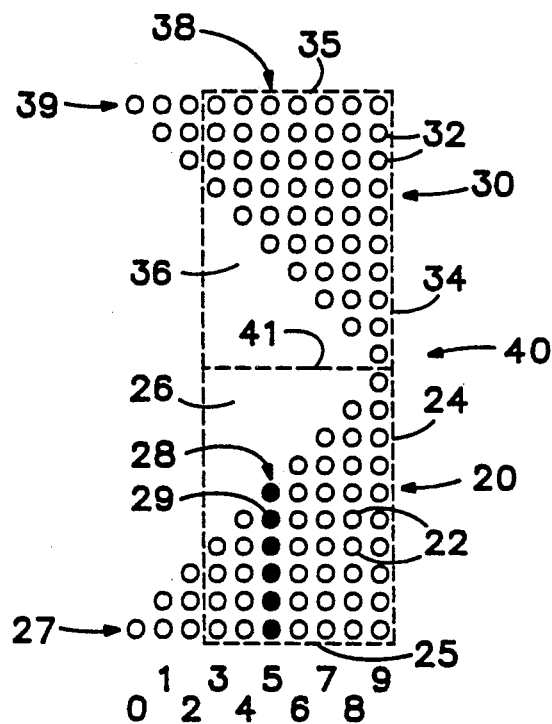
FIG. 2 illustrates an adjacent pair of matrices of dot locations for marking a wafer with two copies of an encoded identifying number according to the present invention.

FIG. 2 illustrates the general arrangement of a binary dot-array encoding system for marking an identifying number on a semiconductor wafer according to the present invention. Referring to FIG. 2, a first matrix of dot locations 20 is shown below a second matrix 30 of equal size. Each matrix 20, 30 includes a matrix of dot locations defining a series of parallel columns.

A predetermined wafer identifying number is encoded as follows. Each digit of the number is represented by a contiguous series of dots scribed or marked in a corresponding column of dot locations in the matrix. The number of dots marked in each column is equal to the numeric value of the corresponding digit plus one dot, illustrated by the formula:

$$n = N + 1 \, dot$$

where N is the numeral value of the digit and n is the same value expressed in scribed dots. The marked dots together form a dot array. The dot locations are marked by a laser scribe system, for example, the Wafermark 200HS available from Lumonics of Camarillo, Calif.

FIG. 2 illustrates this encoding scheme. In the FIG. not all dot locations in the matrix are indicated, to improve clarity. Rather, small circles are shown to indicate the dot locations to be marked to encode each of the numerals zero through ten. The alphanumeric equivalent of each column of dots is shown below the corresponding column. For example, a series of six dots (28) are shown in the column labeled "5". The unmarked dot locations are not shown.

Within each column, selection of the particular dot locations to be marked is determined as follows. Matrix 20 is circumscribed by a dashed line 24 which includes a horizontal baseline 25. A first row of dot locations 27 extends along the baseline 25. These are referred to as origin dot locations. To indicate a predetermined digit in the corresponding column, a series of dot locations are marked which includes the required number of dots (determined as described above), marked on a contiguous series of dot locations that beings at the origin dot location. This arrangement has several advantages explained below.

Accordingly, to indicate each of the numerals 0-9, shown along the bottom of FIG. 2, dots are marked on the wafer in the dot locations indicated by the column of circles aligned over the respective digit. Thus, for example, there are eight circles in the column above the numeral 7. To indicate the numeral 7 in that column of the matrix 20, dots would be marked on the wafer in each of the eight dot locations represented by the circles 22. In accordance with the dot array encoding described above, the first row 27 of dot locations will always be marked. This feature provides a convenient reference for a vision system to read the coded wafer ID number, discussed further below.

Each column has a height that corresponds to ten dot locations. The width of each field is sized to include a number of columns at least equal to the number of digits in a desired wafer identifying number. According to an operative example of the invention, seven columns are used. Accordingly, the dashed line 24 which circumscribes field 20 includes seven columns. Seven digits of identifying numbers could be allocated, for example, to provide a one-digit fab number, a four-digit lot number and a two-digit wafer number.

Matrix 30 has the same height (ten dot locations) and the same width (seven dot locations or columns) as matrix 20. Matrix 3 is positioned in adjacent registration with matrix 20 such that each column of the second matrix is collinear with the corresponding column of the first matrix, for reasons explained below.

Matrix 30 is inverted with respect to matrix 20 about dashed line 41. Accordingly, dashed line 35 along the top of the figure defines the baseline of matrix 30. To represent a wafer identifying number within matrix 30, dots are marked on the wafer in a number of dot locations in each column that corresponds to the respective digit, as explained above. Here, however, the dots are marked on a contiguous series of dot locations that begins at the baseline 35 and extends downward in the figure. For example, a series of dots 38 consists of six dots, representing the number five, in the column labeled "5". A first row 39 of dot locations along baseline 38 of matrix 30 will always be marked, again providing a reference for an automated vision system.

The dot array coding described dramatically reduces the required field size for a vision system to capture, read and determine the wafer number. For example, eight fields of the type shown in FIG. 1 are required to encode a wafer number, whereas the matrix pair 20, 30 of FIG. 2 encodes the same wafer number twice.

Reading the Dot Encoded Wafer Number

The baseline row 27 provides a reference line for the vision system. The baseline row preferably consists of at least eight dots, though the number may be varied, for example, in accordance with the number of digits to be encoded. Each column of dots, representing a digit, extends perpendicular to the baseline beginning with the origin dot in the baseline row. In the case of a pair of fields (20, 30), the baseline rows 27, 39 are parallel to each other and spaced apart by a predetermined distance, for simple and reliable orientation of the vision system. They must be spaced at least 20 dot positions apart so the fields do not overlap. A vision system suitable for practicing the present invention is a model 386HR available from Intelledex of Corvallis, Oreg.

The vision system is arranged to scan the wafer and capture data representing an image of the dot array. A vision system can easily recognize each scribed dot and check its location in one or more of a variety of ways. For example, each column of dots must be contiguous from the baseline row. If any dot location is unmarked, but a dot is detected "higher up" in the same column, the marking is defective.

Second, location of the "highest" dot in each column can be compared to the corresponding dot in the other array of a dot-array pair. Here, "highest" means furthest from the applicable baseline row. The distance of the highest dot from the baseline row of dots determines the indicated digit value.

For a pair of dot arrays, for each column, the highest dot position can be compared to the corresponding dot position in the complementary array based on a straight line calculation: $X1, Y1-X2, Y2=K$, where K is a constant, fixed value $+/-$ a definable error or tolerance. X is the column number or position, so generally X1 equals X2. Y is the distance from the corresponding baseline or baseline row of dots. Where the relation expressed above is not an equality, there is a discrepancy between the two dot arrays in the X column, implying that one of the arrays is defective. Also, if the Y distance is expressed in dots (or dot locations), the sum $Y1+Y2$ must be even. This provides another simple test for dot array validity.

The foregoing validity tests merely illustrate the kinds of tests which can be applied to a dot array of the kind disclosed. These particular tests have the advantages of high speed of calculation, minimal computing hardware requirements, and obviating expensive character recognition software. Other validity tests will be apparent to those skilled in the art in light of this disclosure. Validity checking can be done when a wafer is first marked, and/or when the dot array is "read" during subsequent processing of the wafer.

The likelihood is that, where one field of a pair is defective, the other is not. In the preferred method, three fields, each containing a redundant representation of the same wafer identifying number, are provided. A simple voting algorithm can be applied to determine which array, if any, is defective and ignore it. The identification of the wafer is not lost, however, as the non-defective dot arrays can be used to recover the wafer identifying number.

Figure 3:
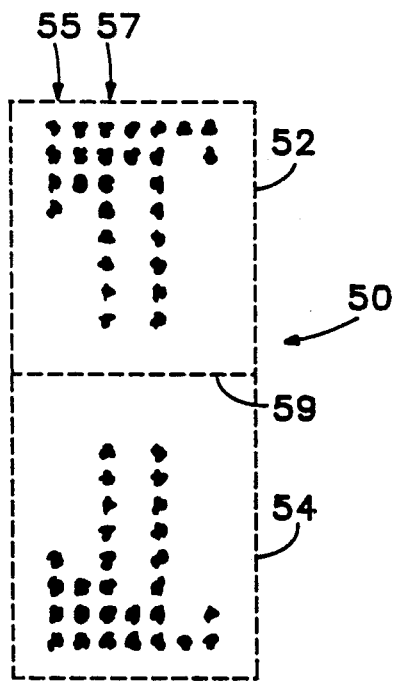
FIG. 3 illustrates a pair of adjacent dot arrays marked on a wafer surface, each dot array including an encoded representation of a wafer identifying number in accordance with the present invention.

FIG. 3 illustrates an example of a wafer surface 50 that has been marked with a predetermined identifying number (3271701) according to the present invention. The surface 50 includes a first field, circumscribed by dashed line 52, and a second field of equal size, circumscribed by dashed line 54. Each field includes a dot array that represents the wafer identifying number. Each dot of the array is inscribed on one of a predetermined matrix of dot locations on the wafer. The matrix includes seven columns and ten rows, as explained above with respect to FIG. 2.

Referring now to the first field 52, the first column 55 is marked in four successive dot locations, beginning at the base location. These four dots encode the digit "3" as explained above. The third column 57 is marked in eight successive dot locations, beginning at the base location, to represent the digit "7." In like fashion, each of the other columns can be decoded into their respective digits. The series of decoded digits can be assembled to form the wafer identifying number, here equal to 3271701.

Referring again to FIG. 3, the second field 54 is identical to the first field 52, albeit inverted about the horizontal axis 59. The fields are aligned so that corresponding columns are collinear. Field 54 includes a second dot array identical to the array described above in field 52. The second array thus provides a duplicate of the complete wafer identifying number. The first and second dot arrays together form an array pair, amenable to validity checking as described previously.

Figure 4:
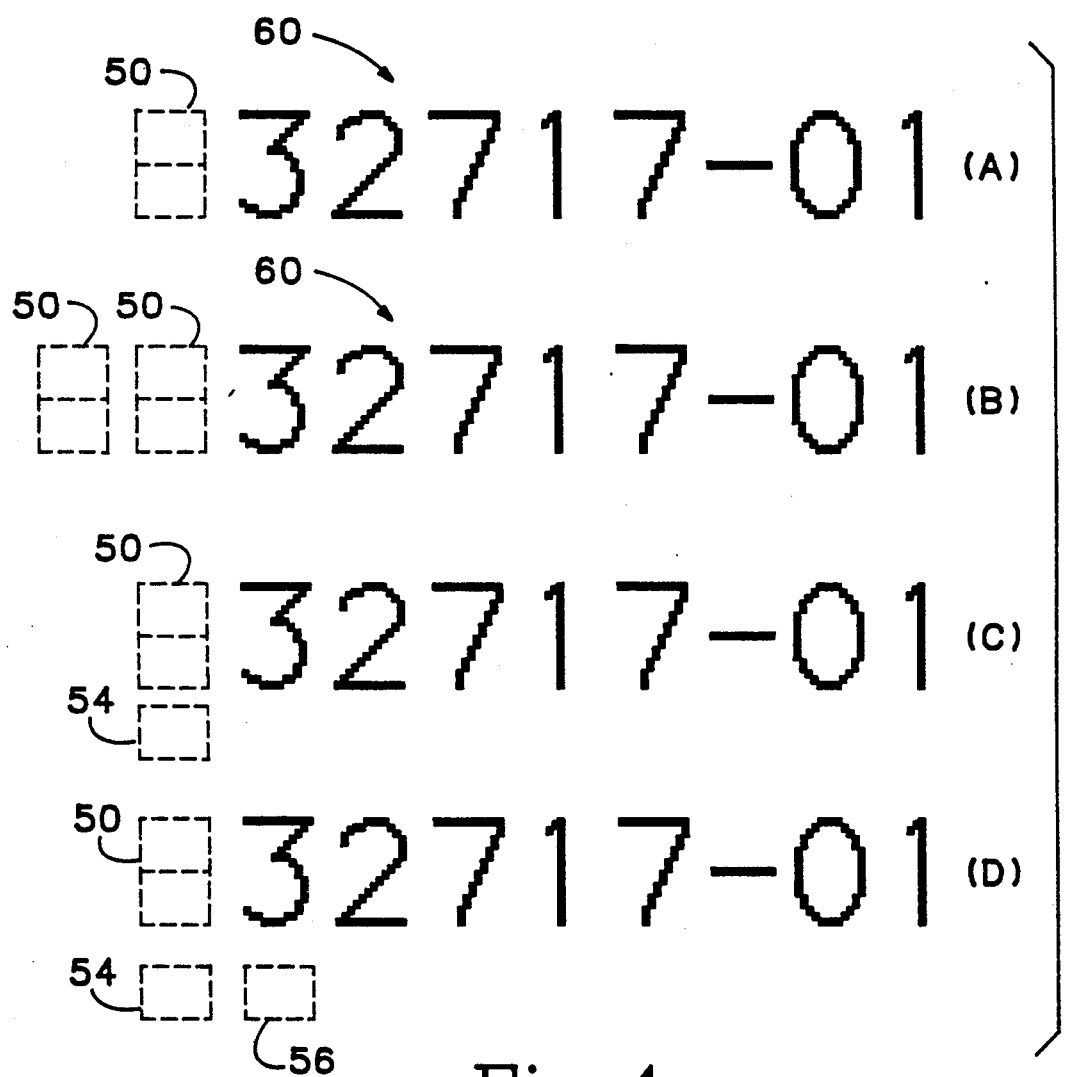
FIG. 4 illustrates four alternative markings of an identifying number on a wafer, each marking including an alphanumeric representation of the identifying number and a plurality of dot arrays, each dot array containing an encoded representation of the wafer identifying number.

FIG. 4 illustrates a series of alternative methods of marking an identifying number on a wafer surface. Each subpart of the FIG. A-D, includes an alphanumeric representation 60 of the wafer identifying number "32717-01." The alphanumeric representations may conveniently be formed of dots as illustrated in FIG. 1.

Referring to FIG. 4(A), the wafer is also marked with a pair of dot arrays, indicated by dashed box 50. Box 50 represents a dot-array pair such as the array pair of FIG. 3. The exact location of the dot array marking is not critical, as long as it does not overlap the alphanumeric marking 60. This FIG. illustrates the relative sizes or wafer area required for these two types of markings. While the pair 50 of dot arrays contains two copies of the wafer identifying number, it occupies a total area equal to about 90% of the wafer area occupied by a single digit of the alphanumeric representation 60.

The alphanumeric version and the dot array version of the wafer identifying number are redundant, as they contain the same information. The dot array code version is superior for machine reading, as it is more reliable and subject to error checking as described above. The hyphen in the alphanumeric representation may be omitted in the dot array encoding because it is unnecessary for the computer system to distinguish, for example, a lot number from wafer number. Thus, by employing the present invention, substantial improvements in reliability may be achieved through redundancy, and vision system cost reduced, without a significant increase in area dedicated to identifying the wafer.

FIG. 4(B) illustrates an alternative wafer marking which includes two copies of the dot array pair 50, for a total of four dot-array encoded copies of the wafer identifying number. Each dot array pair can be checked for validity, as explained. An invalid pair can be detected and ignored for purposes of identifying the wafer. Again, the dot arrays are shown adjacent the alphanumeric representation. This has the advantage of minimizing the total wafer area dedicated to identification markings. The alphanumeric representation 60 may be omitted, but it is convenient for human determination of the wafer number, under appropriate magnification.

In an operative example of a wafer identification system, alphanumeric characters are formed in a 23 by 15 dot array, as illustrated in FIG. 1. A nominal center-to-center dot size is on the order of two microns. The 23 by 15 dot array thus would occupy a wafer area on the order of 50 by 30 microns. Additional space is provided between alphanumeric characters to make them more readable. A 100 x magnification, for example, would produce an apparent character height of about five millimeters or approximately ¼ inch. By comparison, a pair of dot arrays, such as pair 50, which includes two copies of the wafer identifying number, measures about 7 columns by 20 rows. Again assuming a two-micron nominal dot size, the pair of dot arrays would measure only about 14 by 40 microns.

FIG. 4(c) illustrates another alternative embodiment which includes a dot array pair 50 and a single dot array 54. Array 54 contains another copy of the wafer identifying number, encoded as described above. This embodiment thus provides three encoded copies of the identifying number, a convenient arrangement for employing a two-out-of-three voting mechanism for detecting a defective copy.

FIG. 4(d) illustrates yet another alternative embodiment which includes the dot array pair 50, a second dot array pair 54 and a third array pair 56. Arrays 50 and 54 provide three copies of the identifying number as described above. Array 56 provides yet a fourth copy of the identifying number for additional redundancy at minimal additional cost in terms of wafer area.

Having illustrated and described the principles of our invention in a preferred embodiment thereof, it should be readily apparent to those skilled in the art that the invention can be modified in arrangement and detail without departing from such principles. We claim all modifications coming within the spirit an scope of the accompanying claims.

We claim:

1. A method of marking a semiconductor wafer for identification using a computer-controlled laser scribe system, the method comprising:

determining a unique identifying number consisting of an ordered series of digits for identifying the wafer;

forming data in the computer corresponding to a first matrix of dot locations on the wafer, the first matrix consisting of a series of parallel columns of dot locations, each column corresponding to a respective one of the digits and including a predetermined origin dot location, all of the origin dot locations being aligned such that the origin dot locations together form a first baseline, said first baseline extending normal to the columns;

encoding each digit in the computer to form a corresponding number of dots M, where M is an integer equal to the numeral value of the corresponding digit of the identifying number plus one;

in each first matrix column, marking M dots on the wafer in a contiguous series of dot locations that beings at the first baseline, thereby forming a first dot array that represents the identifying number;

forming data in the computer corresponding to a second matrix of dot locations on the wafer non-overlapping the first matrix, the second matrix consisting of a second series of parallel columns of dot locations, each of the second matrix columns including a predetermined origin dot location, and all of the second matrix origin dot locations being aligned so that the second matrix origin dot locations together form a baseline of the second matrix;

aligning the first matrix and the second matrix such that each column of a respective one of the matrices is collinear with a corresponding column of the other matrix;

orienting the second matrix relative to the first matrix so that the second matrix baseline is spaced apart from the first matrix baseline and both the first and second matrices extend in between the first and second baselines; and in each second matrix column, marking M dots on the wafer in a continuous series of dot locations that beings at the second baseline, thereby forming a second dot array that represents the identifying number.

2. A method according to claim 1 further comprising the steps of:

in the first array, in each column, determining a first distance between the marked dot furthest from the corresponding origin dot location and the first baseline;

in the second array, in each column, determining a second distance between the marked dot furthest from the corresponding origin dot location and the second baseline;

in each column, comparing the first distance to the second distance; and determining, for each column, whether or not the first and second distances are equal to within a predetermined tolerance, thereby checking the validity of the wafer marking.

* * * * *